(12) United States Patent
Shao et al.

(10) Patent No.: US 8,884,673 B1
(45) Date of Patent: Nov. 11, 2014

(54) CLOCK TRIMMING APPARATUS AND ASSOCIATED CLOCK TRIMMING METHOD

(71) Applicant: eMemory Technology Inc., Hsin-Chu (TW)

(72) Inventors: Chi-Yi Shao, Taichung (TW); Chi-Chang Lin, New Taipei (TW); Yu-Hsiung Tsai, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/045,883

(22) Filed: Oct. 4, 2013

(51) Int. Cl.
*H03L 7/00* (2006.01)
*H03L 7/08* (2006.01)

(52) U.S. Cl.
CPC .......................................... *H03L 7/08* (2013.01)
USPC ............ 327/160; 327/291; 327/292; 331/1 A; 324/762.02

(58) Field of Classification Search
CPC ...... H03K 5/135; H04L 7/0331; H04L 7/033; H04L 7/0083; G06F 1/10; G06F 1/04; G06F 1/08
USPC ......... 327/291–294, 298, 299, 141, 154–156, 327/159, 160, 144–147, 150, 151, 162; 331/1 A, 1 R, 2, 4, 111, 9, 15, 18, 23, 331/34; 324/762.02; 375/372–376
See application file for complete search history.

(56) References Cited

U.S. PATENT DOCUMENTS

| 6,259,291 B1* | 7/2001 | Huang ........................ 327/160 |
| 6,670,852 B1* | 12/2003 | Hauck ......................... 331/1 A |
| 8,058,893 B1 | 11/2011 | Clark |
| 2011/0156821 A1* | 6/2011 | Ge ................................. 331/34 |

* cited by examiner

*Primary Examiner* — Lincoln Donovan
*Assistant Examiner* — Thomas Skibinski
(74) *Attorney, Agent, or Firm* — WPAT, PC; Justin King

(57) ABSTRACT

A clock trimming apparatus includes an oscillator, a judging unit, a latching unit, and a tracking unit. The oscillator has an input terminal receiving a bias signal and an output terminal generating a clock signal. After a frequency division is performed on the clock signal, the judging unit generates a frequency-divided signal. If the frequency-divided signal matches the reference signal, a pass signal generated by the judging unit is activated. The latching unit is used for generating a trimming completion signal. After the pass signal is activated, the trimming completion signal is activated. The tracking unit is used for counting a pulse number of the reference signal and providing the bias signal to the oscillator according to a trimming code. After the trimming completion signal is activated, the trimming code is stopped being adjusted.

16 Claims, 8 Drawing Sheets

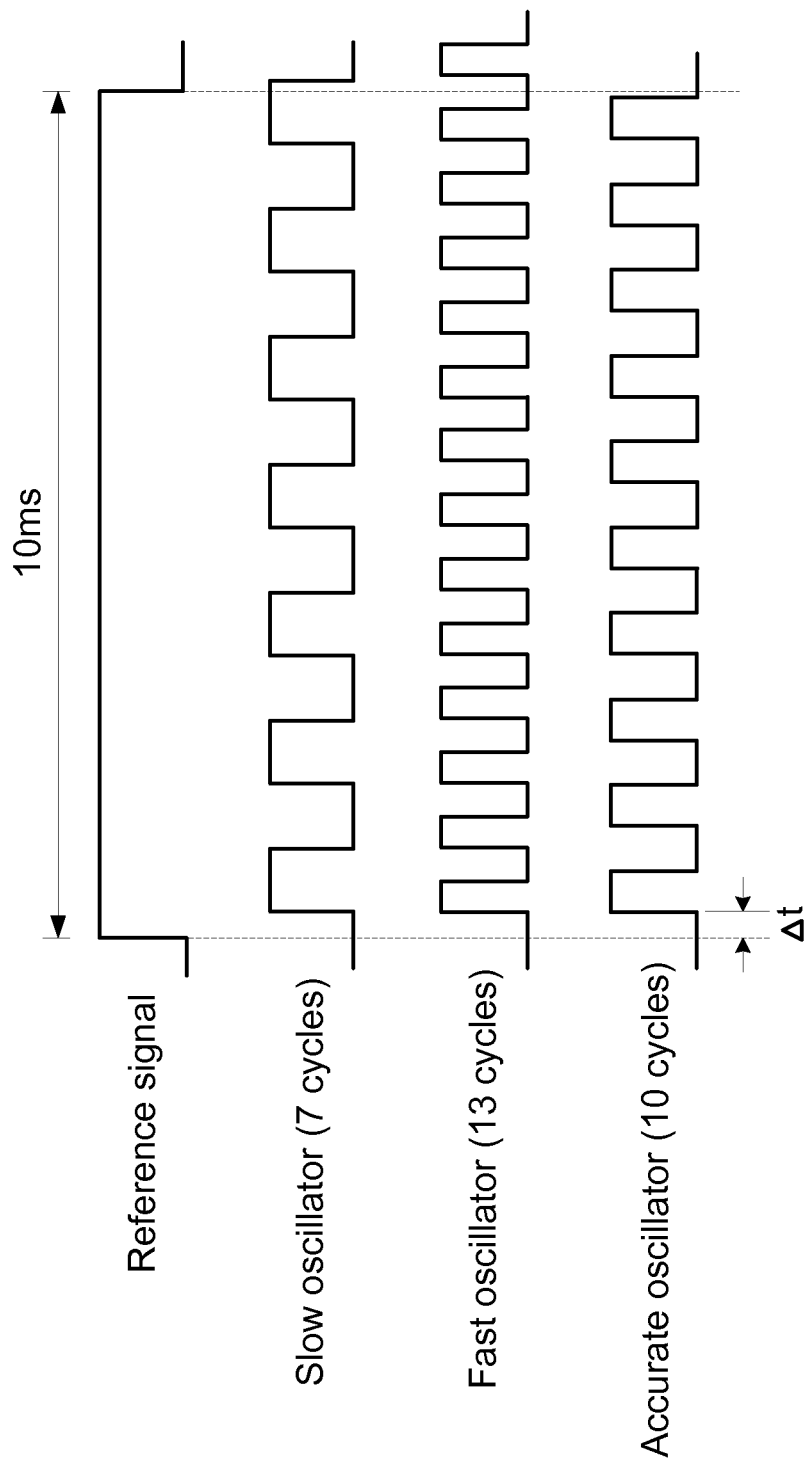

CLOCK TRIMMING APPARATUS AND ASSOCIATED CLOCK TRIMMING METHOD

FIELD OF THE INVENTION

The present invention relates to a clock trimming apparatus and a clock trimming method thereof, and more particularly to an automatic clock trimming apparatus and a clock trimming method thereof.

BACKGROUND OF THE INVENTION

Generally, for designing a relaxation oscillator of an integrated circuit, it is necessary to perform a clock trimming action. After the clock trimming action is done, the relaxation oscillator may generate the accurate clock signals.

For example, a system for reducing the test time of an internal oscillator has been disclosed in U.S. Pat. No. 8,058,893, which is entitled "Frequency trimming for internal oscillator for test-time reduction". FIG. 1A schematically illustrates the architecture of a conventional clock trimming system. FIG. 1B is a schematic timing waveform diagram illustrating associated signals processed by the conventional clock trimming system of FIG. 1A. The conventional clock trimming system 10 is disclosed in U.S. Pat. No. 8,058,893, and comprises a tester 12 and a microcontroller integrated circuit 11. The microcontroller integrated circuit 11 comprises a crystal oscillator 21, an on-chip oscillator 13, a bus 19, a memory 18, a trimming register 15, a processor 17, an on-chip debugger 22, an I/O register 16, a timer 14, a multiplexer (MUX) 20, and plural terminals 23~26.

After the system 10 starts to perform a clock trimming action, a test program 28 in the tester 12 is firstly converted into a serial data. Then, the serial data is transmitted to and stored into the memory 18 through the terminal 26, the on-chip debugger 22 and the bus 19. Then, according to the test program 28, the processor 17 generates a trimming value to the trimming register 15 and provides a control signal Control with a logic state "1" to the multiplexer 20. According to the trimming value in the trimming register 15, the on-chip oscillator 13 generates a clock signal CLK to the timer 14 through the multiplexer 20.

In case that a reference signal in a high-level state is outputted from the tester 12 to the timer 14 through the terminal 23, the timer 14 is enabled to start to count the pulse number of the clock signal CLK. When the reference signal goes to the low level, a counting value Count is outputted from the timer 14 to the processor 17 through the bus 19. Moreover, according to the counting value Count, the trimming value 29 is adjusted by the processor 17. Consequently, the frequency trimming action of the clock signal CLK is done.

The above steps are repeatedly performed. That is, the processor 17 will sequentially generate different trimming values and judge the clock signal CLK according to the counting value Count from the timer 14. In case that the counting value Count received by the processor 17 complies with a predetermined value, it is determined that the frequency of the clock signal CLK reaches a predetermined frequency. Meanwhile, the corresponding trimming value 29 is stored into the memory 18. Afterwards, the processor 17 controls the I/O register 16 to issue a completion signal Done to the tester 12 through the terminal 24. The completion signal Done may inform the tester 12 that the clock trimming action is completed. On the other hand, after the trimming values are sequentially generated by the processor 17, if the corresponding counting values Count fail to comply with the predetermined value, the processor 17 controls the I/O register 16 to issue a fail signal Fail to the tester 12 through the terminal 25. The fail signal Fail may inform the tester 12 that the clock trimming action is failed.

Please refer to FIG. 1B. It is assumed that the system 10 intends to adjust the frequency of the clock signal CLK to a target oscillation frequency of 1000 Hz. If the counting value generated by the timer 14 is 7 during the high-level time period (10 milliseconds) of the reference signal, the clock signal CLK generated by the on-chip oscillator 13 has a slower oscillation frequency of about 700 Hz. In other words, the on-chip oscillator 13 may be considered as a slow oscillator. Under this circumstance, the trimming value needs to be increased by the processor 17.

On the other hand, if the counting value generated by the timer 14 is 13 during the high-level time period (10 milliseconds) of the reference signal, the clock signal CLK generated by the on-chip oscillator 13 has a faster oscillation frequency of about 1300 Hz. In other words, the on-chip oscillator 13 may be considered as a fast oscillator. Under this circumstance, the trimming value needs to be decreased by the processor 17.

On the other hand, if the counting value generated by the timer 14 is 10 during the high-level time period (10 milliseconds) of the reference signal, the clock signal CLK generated by the on-chip oscillator 13 has an accurate oscillation frequency of about 1000 Hz. In other words, the on-chip oscillator 13 may be considered as an accurate oscillator. Under this circumstance, the corresponding trimming value is recorded into the memory 18 by the processor 17, and the clock trimming action is completed.

However, as mentioned in U.S. Pat. No. 8,058,893, some drawbacks may occur. For example, since the reference signal and clock signal CLK are not synchronized, the measuring error ($\Delta t$) may be miscounted by up to one cycle.

SUMMARY OF THE INVENTION

The present invention provides a clock trimming apparatus and an associated clock trimming method. By synchronizing the reference signal and clock signal, the trimmed clock signal is more accurate.

An embodiment of the present invention provides a clock trimming apparatus. The clock trimming apparatus receives a reference signal. The clock trimming apparatus includes an oscillator, a judging unit, a latching unit, and a tracking unit. The oscillator has an input terminal receiving a bias signal and an output terminal generating a clock signal. During a specified time duration of the reference signal, a frequency of the clock signal generated by the oscillator is correlated with an amplitude of the bias signal. The judging unit receives the clock signal and the reference signal. After a frequency division is performed on the clock signal, the judging unit generates a frequency-divided signal. If the frequency-divided signal matches the reference signal, a pass signal generated by the judging unit is activated. The latching unit is used for generating a trimming completion signal. After the pass signal is activated, the trimming completion signal is activated. The tracking unit is used for receiving the reference signal, counting a pulse number of the reference signal, generating a trimming code, and providing the bias signal to the oscillator according to the trimming code. After the trimming completion signal is activated, the trimming code is stopped being adjusted.

Another embodiment of the present invention provides a clock trimming method includes the following steps. In a step (a), a reference signal is received. In a step (b), a clock signal is generated according to an initial value of a trimming code.

In a step (c), a frequency division is performed on the clock signal, so that a frequency-divided signal is generated. Then, a step (d) is performed to judge whether a relationship between the frequency-divided signal and the reference signal complies with a specified relationship. If the relationship between the frequency-divided signal and the reference signal does not comply with the specified relationship, a step (e) is performed. Whereas, if the relationship between the frequency-divided signal and the reference signal complies with the specified relationship, a step (f) is performed. In the step (e), the trimming code is added by one increment and the clock signal is generated according to the trimming code and the increment, and the step (c) is repeatedly performed. In the step (f), the clock signal is controlled to be operated at a target oscillation frequency according to the trimming code corresponding to the specified relationship.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1B (prior art) is a schematic timing waveform diagram illustrating associated signals processed by the conventional clock trimming system of FIG. 1A;

DETAILED DESCRIPTION OF PREFERRED EMBODIMENTS

Figure 1A:
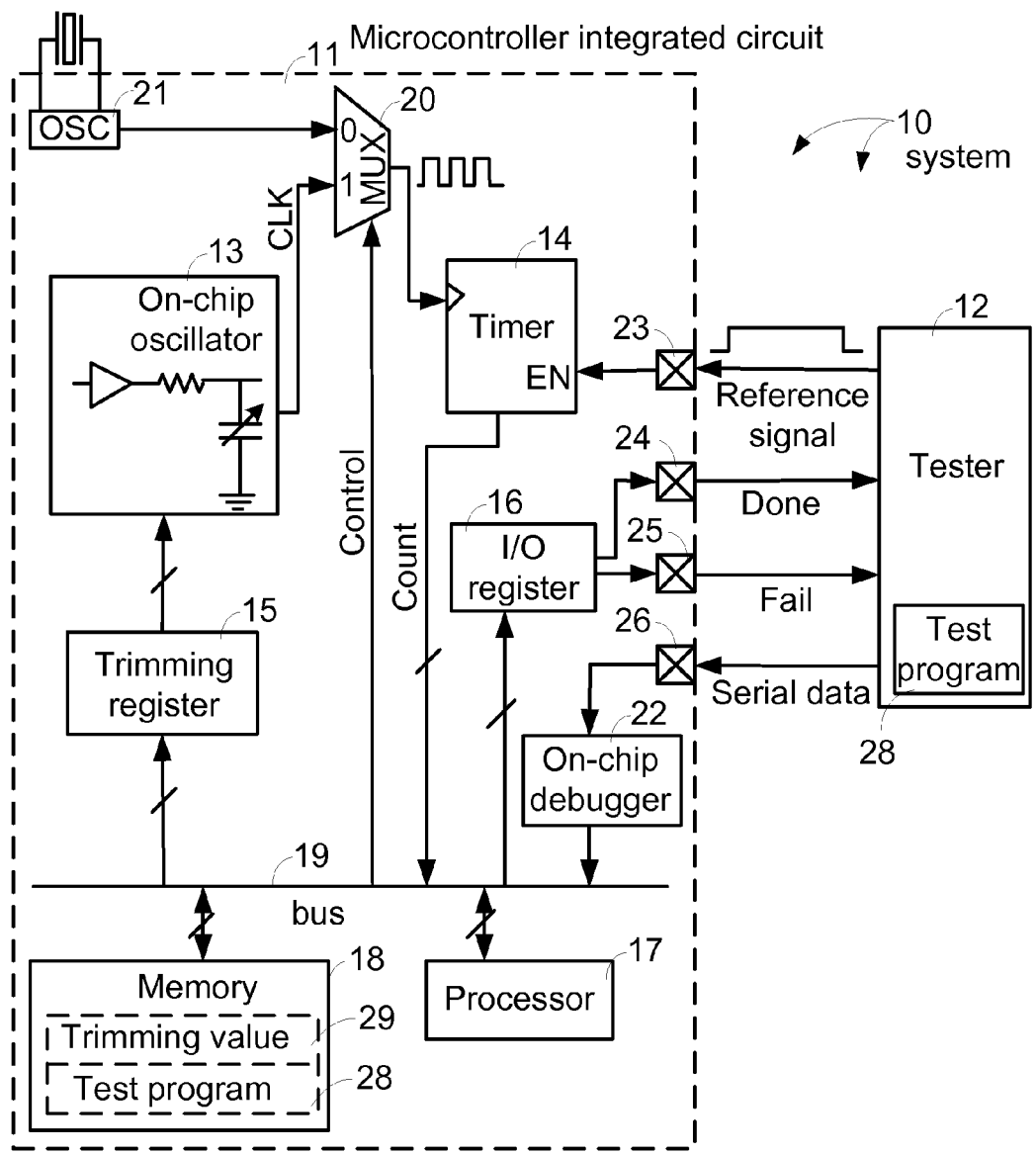
FIG. 1A (prior art) schematically illustrates the architecture of a conventional clock trimming system.
Figure 2A:
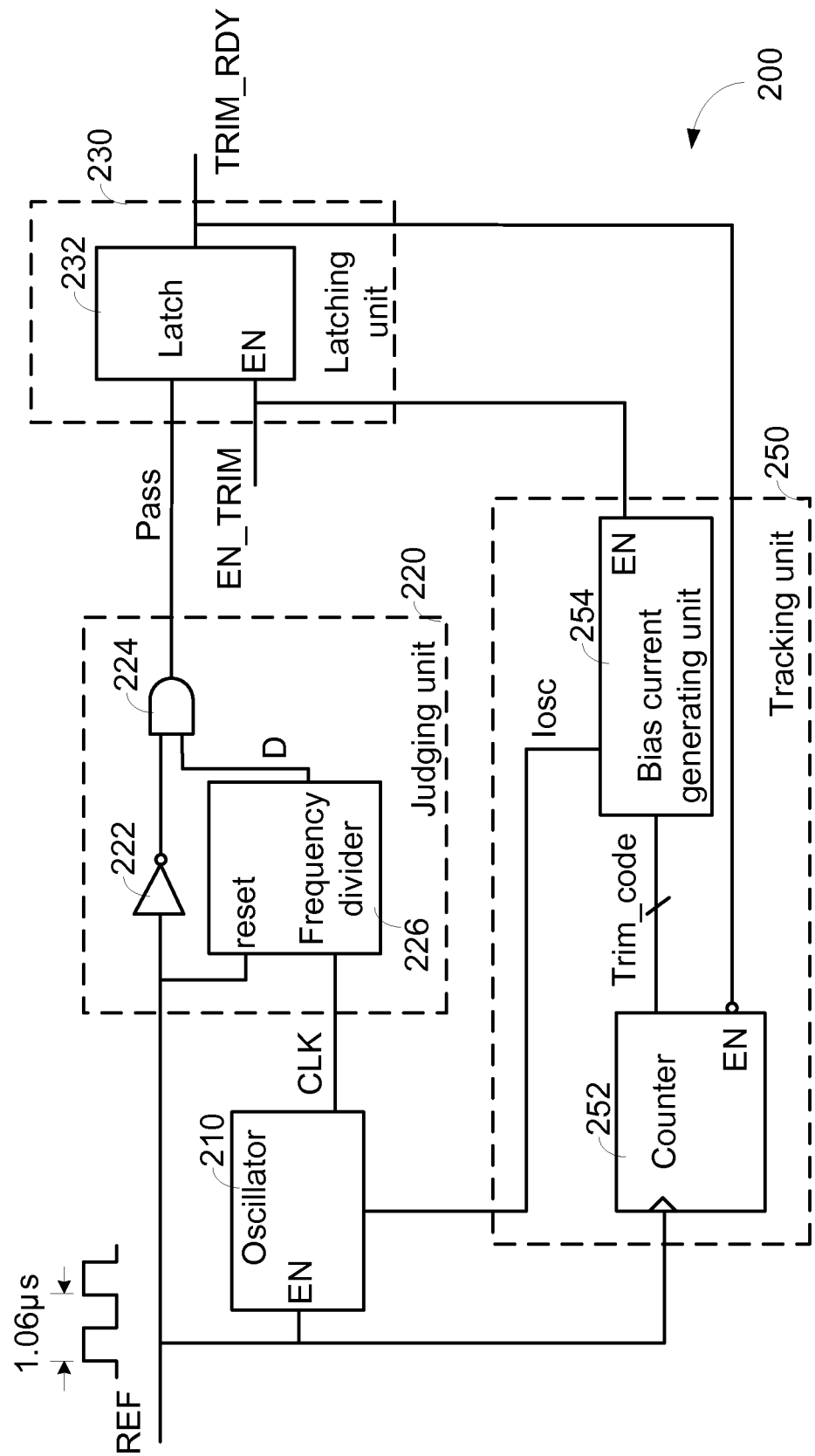
FIG. 2A schematically illustrates the architecture of a clock trimming apparatus according to a first embodiment of the present invention.
Figure 2B:
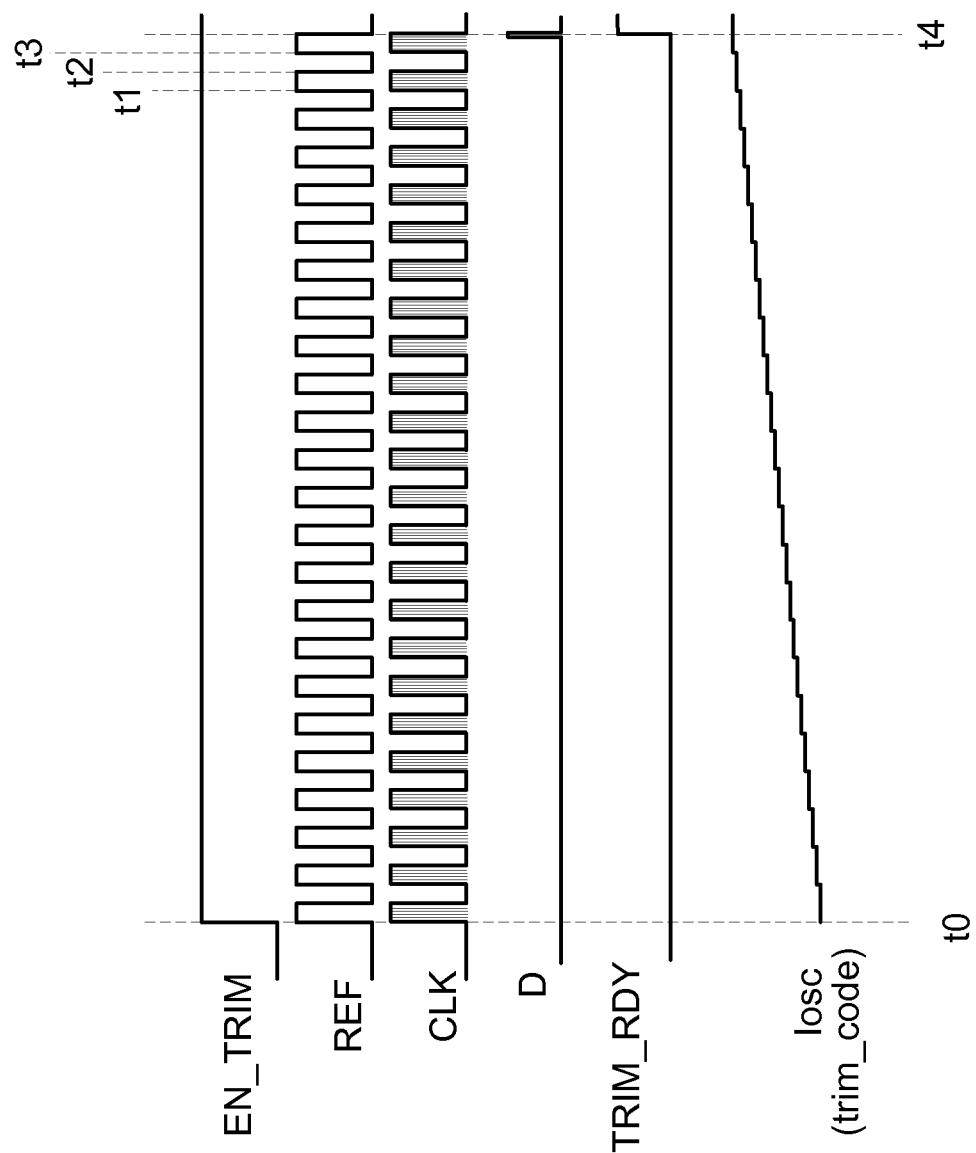
FIGS. 2B, 2C and 2D are schematic timing waveform diagrams illustrating associated signals processed by the clock trimming apparatus of FIG. 2A.
Figure 2C:
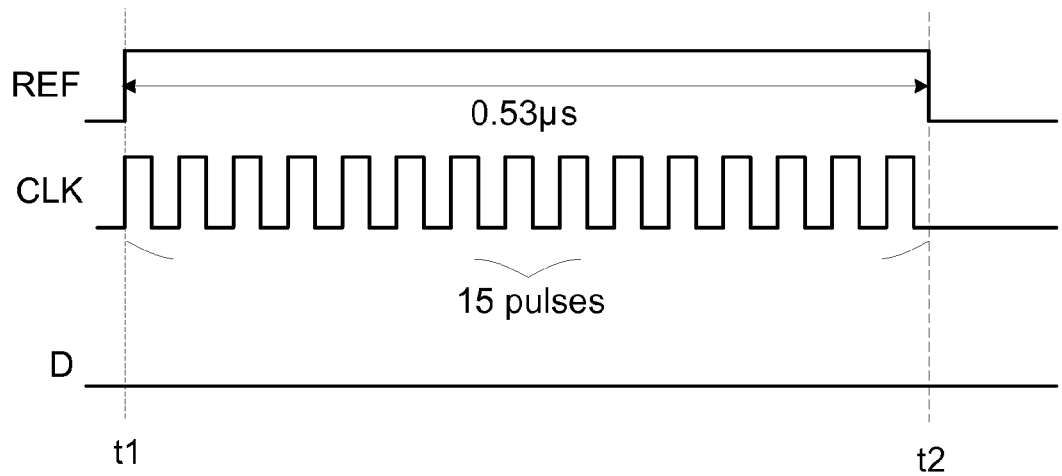
Figure 2D:
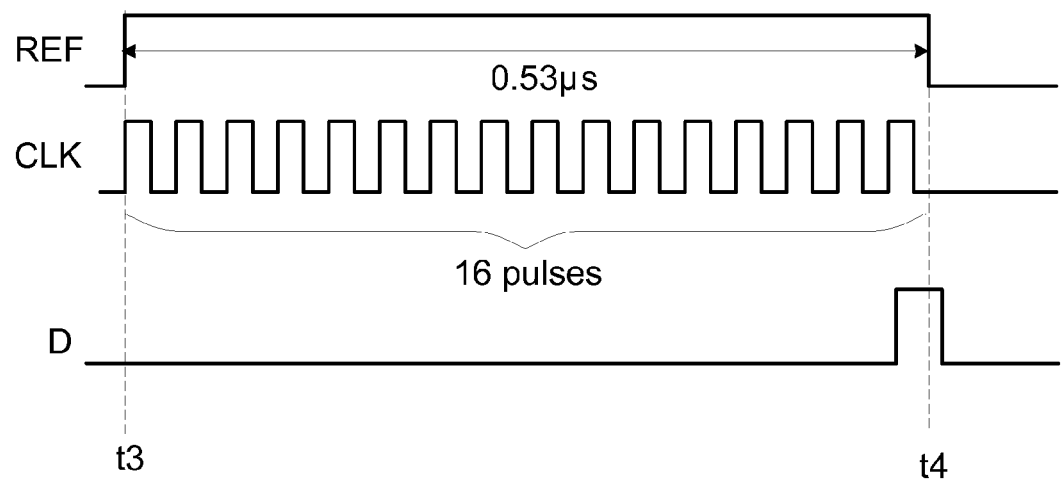

FIG. 2A schematically illustrates the architecture of a clock trimming apparatus according to a first embodiment of the present invention. FIGS. 2B, 2C and 2D are schematic timing waveform diagrams illustrating associated signals processed by the clock trimming apparatus of FIG. 2A. The clock trimming apparatus 200 comprises an oscillator 210, and a judging unit 220, a latching unit 230, and a tracking unit 250.

A crystal oscillator (not shown) provides a reference signal REF with an accurate oscillation frequency to the clock trimming apparatus 200. According to the embodiment of the present invention, the oscillator 210 is a current-mode relaxation oscillator. As a bias current Iosc is increased, the frequency of the generated clock signal CLK is increased. As the bias current Iosc is decreased, the frequency of the generated clock signal CLK is decreased. In other word, the frequency of the clock signal CLK is positively correlated with the amplitude of the bias current Iosc. Also, the oscillator 210 is capable of being implemented by a voltage-mode relaxation oscillator, and the clock signal CLK generated by the oscillator 210 is proportional to a bias voltage. That is to say, the oscillator 210 is controlled by a bias signal, and the bias signal is the bias current or the bias voltage.

The judging unit 220 comprises a NOT gate 222, an AND gate 224, and a frequency divider 226. A reset terminal of the frequency divider 226 receives the reference signal REF. When the reference signal REF is at a low-level state, the frequency divider 226 is reset. Moreover, an input terminal of the frequency divider 226 receives the clock signal CLK from the oscillator 210. After the frequency divider 226 performs a frequency division on the clock signal CLK, a frequency-divided signal D is generated.

An input terminal of the NOT gate 222 receives the reference signal REF. A first input terminal of the AND gate 224 is connected with an output terminal of the NOT gate 222. A second input terminal of the AND gate 224 receives the frequency-divided signal D. A pass signal Pass is outputted from an output terminal of the AND gate 224. Generally, the high-level state of the pass signal Pass indicates that the pass signal Pass is activated, and the low-level state of the pass signal Pass indicates that the pass signal Pass is inactivated.

In an embodiment, the frequency divider 226 is used for dividing frequency of the clock signal CLK by 32, thereby generating the frequency-divided signal D. That is, whenever 16 pulses of the clock signal CLK are generated, the level state of the frequency-divided signal D will be changed. It is noted that the frequency of the clock signal CLK may be divided by another specified value according to the practical requirements. After the frequency-divided signal D is generated, the clock trimming action may be performed.

The latching unit 230 comprises a latch 232. An enabling terminal EN of the latch 232 is controlled by an enable trimming signal EN_TRIM. An input terminal of the latch 232 receives the pass signal Pass. A trimming completion signal TRIM_RDY is outputted from the latch 232. Generally, after the latch 232 is enabled by the enable trimming signal EN_TRIM, the trimming completion signal TRIM_RDY is in the low level state. The low level state of the trimming completion signal TRIM_RDY indicates that the trimming completion signal TRIM_RDY is inactivated and the clock trimming action is not completed. On the other hand, after the pass signal Pass is activated, the trimming completion signal TRIM_RDY generated by the latch 232 is in the high-level state. The high-level state of the trimming completion signal TRIM_RDY indicates that the trimming completion signal TRIM_RDY is activated and the clock trimming action is completed.

The tracking unit 250 comprises a counter 252 and a bias current generating unit 254. An enabling terminal EN of the counter 252 receives the trimming completion signal TRIM_RDY. An input terminal of the counter 252 receives the reference signal REF. A trimming code Trim_code is outputted from an output terminal of the counter 252. Generally, if the trimming completion signal TRIM_RDY is inactivated, the counter 252 is enabled. Meanwhile, the counter 252 starts to count the pulse number of the reference signal REF and generate the trimming code Trim_code. On the other hand, if the trimming completion signal TRIM_RDY is activated, the counter 252 is disabled. Meanwhile, the counter 252 stops counting the pulse number of the reference signal REF, and thus the trimming code Trim_code is no longer changed.

An enabling terminal EN of the bias current generating unit 254 receives the enable trimming signal EN_TRIM. Moreover, if the enable trimming signal EN_TRIM is activated, the bias current generating unit 254 generates a corresponding bias current Iosc to the oscillator 210 according to the trimming code Trim_code. Furthermore, if the oscillator 210 is implemented by the voltage-mode relaxation oscillator, the bias current generating unit should be replaced by a bias voltage generating unit.

In this embodiment, the value of the trimming code Trim_code denotes the pulse number of the reference signal REF, and the magnitude of the bias current Iosc is in direct proportion to the value of the trimming code Trim_code.

Please refer to FIG. 2B. In this embodiment, the clock trimming apparatus 200 is used to adjust the frequency of the clock signal CLK of the oscillator 210 to a target oscillation frequency of 30 MHz. Moreover, the reference signal REF generated by the crystal oscillator (not shown) has a duty cycle of 50% and a period of 1.06 μs (i.e. the high-level time period is 0.53 μs and the low-level time period is 0.53 μs). At the time point t0, the enable trimming signal EN_TRIM is activated, and thus the clock trimming apparatus 200 starts to perform a clock trimming action.

As shown in FIG. 2B, the reference signal REF is changed to the high-level state at the time point to. At the same time, the counter 252 generates an initial counting value (i.e. an initial value of the trimming code Trim_code) to the bias current generating unit 254. In addition, the bias current generating unit 254 provides a corresponding initial bias current Iosc to the oscillator 210. During the first high-level time period of the reference signal REF, the oscillator 210 is enabled. Moreover, according to the initial bias current Iosc, the oscillator 210 starts to generate the clock signal CLK to the frequency divider 226.

After the time point t0 and during the first high-level time period (0.53 μs) of the reference signal REF, the clock signal CLK is unable to generate 16 pulses. Consequently, the frequency-divided signal D from the frequency divider 226 fails to be changed to the high-level state. Under this circumstance, the trimming completion signal TRIM_RDY is inactivated, and maintained in the low-level state.

After the time point t0 and during the first low-level time period (0.53 μs) of the reference signal REF, the counting value of the counter 252 is added by 1. That is, the trimming code Trim_code is added by 1. Consequently, one increment (Δi) is added to the bias current Iosc to be received by the oscillator 210. That is, during the first low-level time period of the reference signal REF, one increment (Δf) is added to the frequency of the clock signal CLK. Since the clock signal CLK is still unable to generate 16 pulses during the second high-level time period (0.53 μs) of the reference signal REF, the frequency-divided signal D from the frequency divider 226 fails to be changed to the high-level state. Under this circumstance, the trimming completion signal TRIM_RDY is inactivated, and maintained in the low-level state.

Similarly, during the time duration from the time point t0 to the time point t3, the pulse number of the reference signal REF is gradually increased. Consequently, the trimming code Trim_code, the bias current Iosc and the frequency of the clock signal CLK are gradually increased. Moreover, since the clock signal CLK is still unable to generate 16 pulses during the high-level time periods of the reference signal REF, the frequency-divided signal D from the frequency divider 226 fails to be changed to the high-level state. Under this circumstance, the trimming completion signal TRIM_RDY is inactivated, and maintained in the low-level state.

From the time point t3 to the time point t4, the clock signal CLK is able to generate 16 pulses during the high-level time period of the reference signal REF. Consequently, the frequency-divided signal D from the frequency divider 226 is changed to the high-level state. Meanwhile, a pass signal Pass in a high-level state is outputted from the AND gate 224. After the pass signal Pass is activated, the trimming completion signal TRIM_RDY generated by the latch 232 is in the high-level state. The high-level state of the trimming completion signal TRIM_RDY indicates that the trimming completion signal TRIM_RDY is activated and the clock trimming action is completed.

From the above discussions, the frequency of the clock signal CLK is controlled to be gradually increased after the time point to. When the clock signal CLK is able to generate 16 pulses within 0.53 μs, the frequency of the clock signal CLK is approximately 30 MHz (i.e. 16/0.53 μs≈30 MHz). That is, according to the trimming code Trim_code corresponding to the time point t4, the oscillator 210 can generate the clock signal CLK with the target oscillation frequency of 30 MHz.

FIG. 2C is a schematic timing waveform diagram illustrating associated signals processed by the clock trimming apparatus of FIG. 2A during the time duration from the time point t1 and the time point t2. As shown in FIG. 2C, the reference signal REF is in the high-level state during the time duration from the time point t1 and the time point t2. During this time duration, the clock signal CLK generates 15 pulses. Consequently, the frequency-divided signal D fails to be changed to the high-level state.

FIG. 2D is a schematic timing waveform diagram illustrating associated signals processed by the clock trimming apparatus of FIG. 2A during the time duration from the time point t3 and the time point t4. As shown in FIG. 2D, the reference signal REF is in the high-level state during the time duration from the time point t3 and the time point t4. In comparison with FIG. 2C (during the time duration from the time point t1 and the time point t2), one increment (Δf) is added to the frequency of the clock signal CLK during the time duration from the time point t3 and the time point t4. Moreover, during the time duration from the time point t3 and the time point t4, the clock signal CLK generates 16 pulses. Consequently, the frequency-divided signal D is changed from the low-level state to the high-level state when the frequency divider 226 counts the 16$^{th}$ pulse. After the time point t4, the reference signal REF is changed to the low-level state, the frequency divider 226 is reset and the frequency-divided signal D is changed to the low-level state. Consequently, the pass signal Pass is activated at the time point t4. After the pass signal Pass is activated, the trimming completion signal TRIM_RDY generated by the latch 232 is in the high-level state. The high-level state of the trimming completion signal TRIM_RDY indicates that the trimming completion signal TRIM_RDY is activated and the clock trimming action is completed.

Please refer to FIGS. 2C and 2D again. At the rising edge of the reference signal REF, the oscillator 210 is also enabled. Consequently, the rising edge of the first pulse of the clock signal CLK is aligned with the rising edge of the reference signal REF, and the trimmed frequency of the clock signal CLK is closer to the target oscillation frequency. That is, by synchronizing the reference signal and clock signal, the trimmed clock signal produced by the clock trimming apparatus of the present invention is more accurate.

Figure 3:
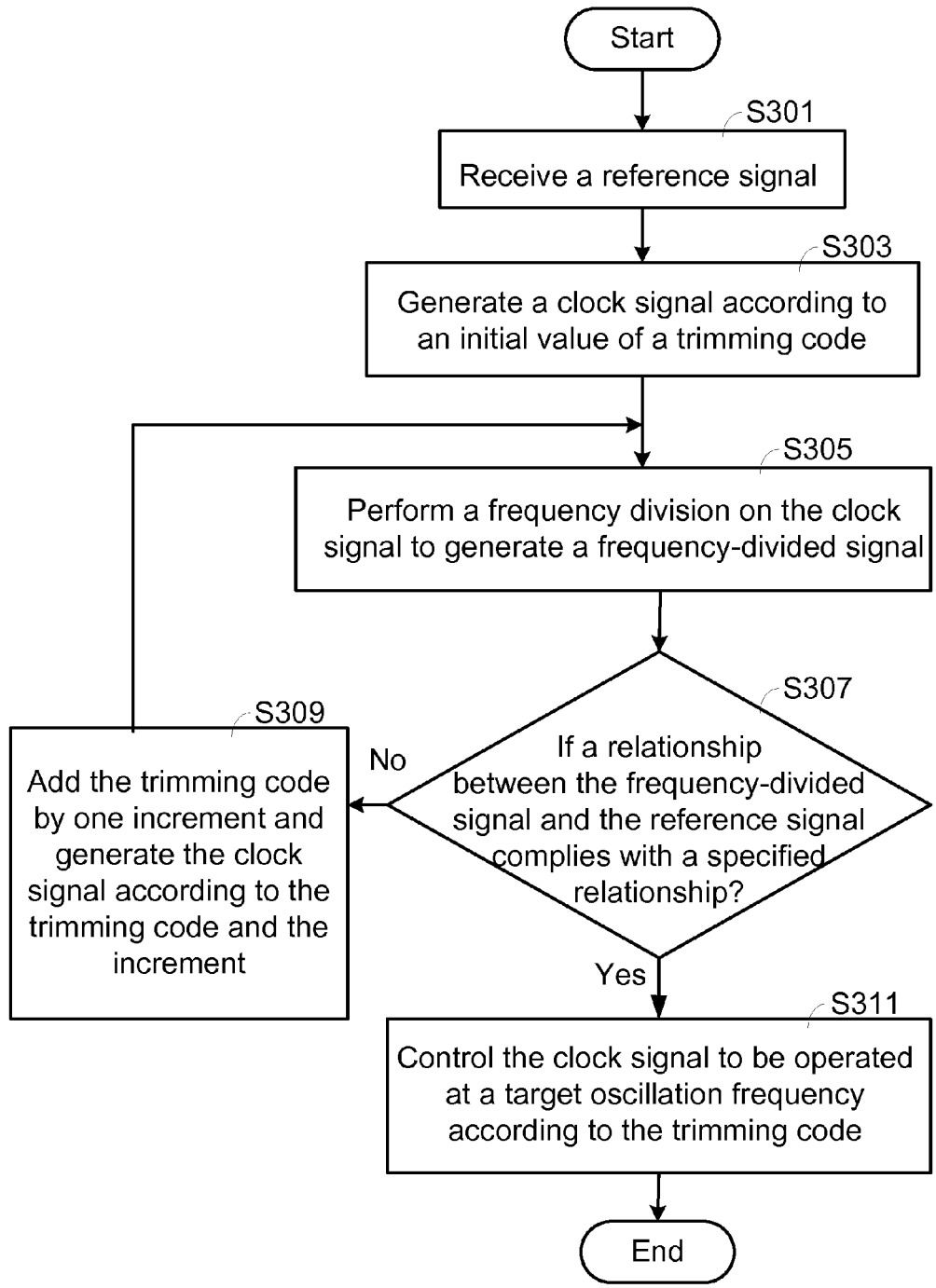
FIG. 3 is a flowchart illustrating a clock trimming method according to a first embodiment of the present invention.

FIG. 3 is a flowchart illustrating a clock trimming method according to a first embodiment of the present invention.

Firstly, in the step S301, a reference signal REF is received. Then, in the step S303, a clock signal CLK is generated according to an initial value of a trimming code. Moreover, the rising edge of the first pulse of the clock signal CLK is aligned with the rising edge of the reference signal REF. Then, in the step S305, a frequency division is performed on the clock signal CLK, so that a frequency-divided signal D is generated.

Then, the step S307 is performed to judge whether a relationship between the frequency-divided signal D and the reference signal REF complies with a specified relationship. If the relationship between the frequency-divided signal D and the reference signal REF complies with the specified relationship, the clock signal CLK is controlled to be operated at a target oscillation frequency according to the trimming code Trim_code (Step S311).

On the other hand, if the relationship between the frequency-divided signal D and the reference signal REF does not comply with the specified relationship, the trimming code Trim_code is added by one increment and the clock signal is generated according to the trimming code Trim_code and the increment (Step S309), and then the step S305 is repeatedly performed. Moreover, the rising edge of the first pulse of the clock signal CLK is aligned with the rising edge of the reference signal REF.

In the clock trimming method of this embodiment, the step S307 of judging whether the relationship between the frequency-divided signal D and the reference signal REF complies with the specified relationship may be performed by judging whether a voltage level of the frequency-divided signal D is changed during a specified time duration. If the voltage level of the frequency-divided signal D is not changed, it means that the relationship between the frequency-divided signal D and the reference signal REF does not comply with the specified relationship. On the other hand, if the voltage level of the frequency-divided signal D is changed, it means that the relationship between the frequency-divided signal D and the reference signal REF complies with the specified relationship.

Figure 4:
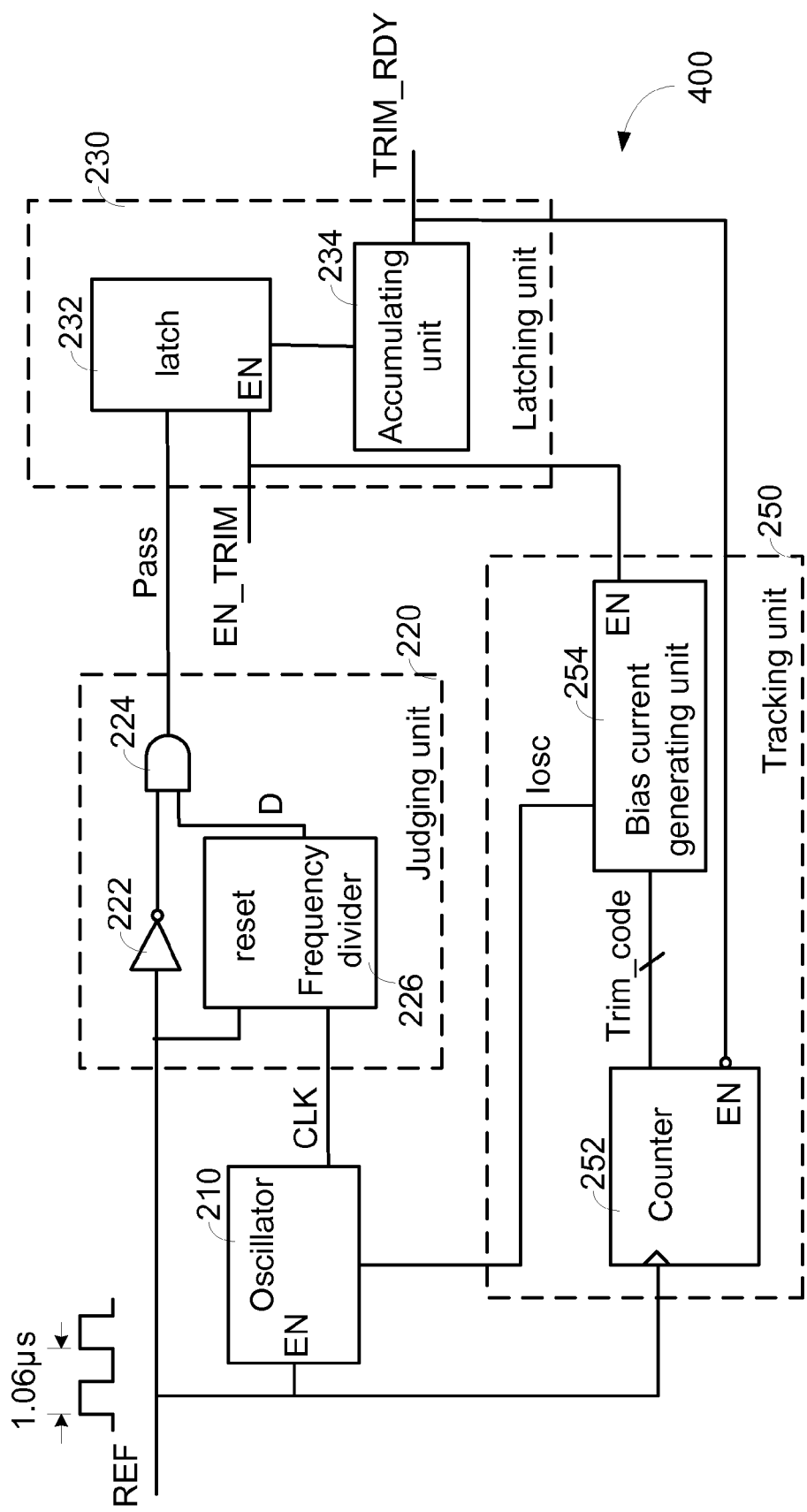
FIG. 4 schematically illustrates the architecture of a clock trimming apparatus according to a second embodiment of the present invention.

FIG. 4 schematically illustrates the architecture of a clock trimming apparatus according to a second embodiment of the present invention. In comparison with the clock trimming apparatus 200 of FIG. 2A, the clock trimming apparatus 400 of FIG. 4 further comprises an accumulating unit 234. The accumulating unit 234 is included in the latching unit 230. In case that the AND gate 224 is interfered by noise, a glitch may occur. Due to the glitch, the latch 230 is erroneously operated, and thus the completion of the clock trimming action may be erroneously judged. In this embodiment, the accumulating unit 234 is used for avoiding the situation of erroneously judging the clock trimming action.

In the clock trimming apparatus of this embodiment, after an output signal from the latch 232 is activated to be in the high-level state for three consecutive times, the trimming completion signal TRIM_RDY in the high-level state can be generated by the accumulating unit 234. The high-level state of the trimming completion signal TRIM_RDY indicates that the clock trimming action is completed. In other words, for activating the trimming completion signal TRIM_RDY, the clock trimming apparatus of this embodiment should confirm that output signals from the latch 232 corresponding to three consecutive trimming codes (Trim_code) are all in the high-level state. It is noted that the three consecutive times may be changed into a specified number of consecutive times according to the practical requirements.

On the other hand, if the output signals from the latch 232 are not in the high-level state for three consecutive times, the cumulative value of the accumulating unit 234 will be cleared, and the voltage level of the output signal from the latch 232 is detected again. Moreover, even if the AND gate 224 is interfered by noise to generate glitch and the latch 230 is erroneously operated, the use of the accumulating unit 234 can avoid erroneous judgment by detecting whether three consecutive output signals are in the high-level state.

After the trimming completion signal TRIM_RDY is activated, any one of the three consecutive trimming codes (Trim_code) may be selected, and the clock signal CLK of the oscillator 210 is controlled to be operated at a target oscillation frequency according to the selected trimming code. For example, a median value of the three consecutive trimming codes may be selected to control the clock signal CLK of the oscillator 210.

It is to be noted that in another embodiment, the NOT gate 222 and the AND gate 224 can be omitted. That is to say, the judging unit only includes a frequency divider 226 which outputs a frequency-divided signal D. Moreover, the frequency-divided signal D is directly outputted as the pass signal.

Figure 5:
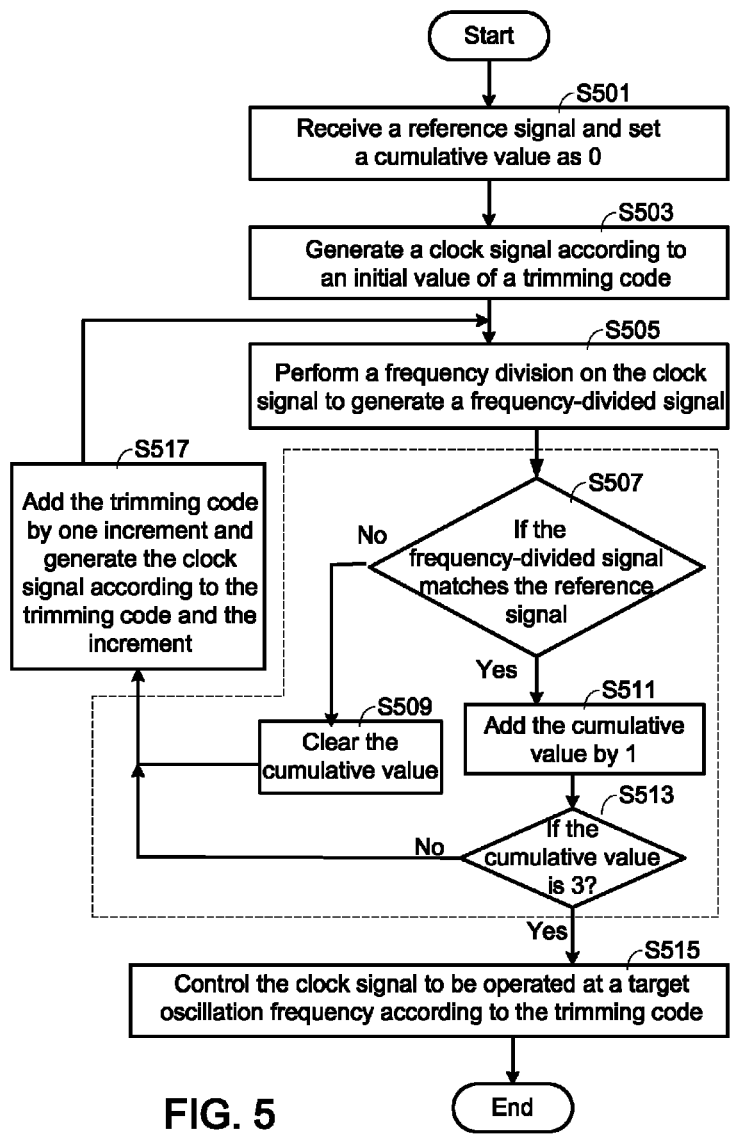
FIG. 5 is a flowchart illustrating a clock trimming method according to a second embodiment of the present invention.

FIG. 5 is a flowchart illustrating a clock trimming method according to a second embodiment of the present invention. In comparison with the clock trimming method of the first embodiment as shown in FIG. 3, the clock trimming method of this embodiment sets an initial cumulative value as 0. Moreover, the steps S507-S513, which are circumscribed by dotted lines, are used to define the specified relationship between the frequency-divided signal and the reference signal.

Firstly, in the step S501, a reference signal REF is received, and a cumulative value is set as 0. Then, in the step S503, a clock signal CLK is generated according to an initial value of a trimming code Trim_code. Then, in the step S505, a frequency division is performed on the clock signal CLK, so that a frequency-divided signal D is generated.

Then, the step S507 is performed to judge whether the frequency-divided signal D matches the reference signal REF. If the frequency-divided signal D does not match the reference signal REF, the cumulative value is cleared (Step S509), and the trimming code Trim_code is added by one increment and the clock signal is generated according to the trimming code Trim_code and the increment (Step S517), and then the step S505 is repeatedly performed. Moreover, the rising edge of the first pulse of the clock signal CLK is aligned with the rising edge of the reference signal REF.

If the frequency-divided signal D matches the reference signal REF, the cumulative value is added by 1 (Step S511), and then the step S513 is performed to judge whether the cumulative value is 3.

If the judging condition of the step S513 is not satisfied, the step S517 is repeatedly done. On the other hand, if the judging condition of the step S513 is satisfied, the clock signal CLK is controlled to be operated at a target oscillation frequency according to the trimming code Trim_code (Step S515).

In the clock trimming method of this embodiment, after the trimming completion signal TRIM_RDY is activated, one of the three consecutive trimming codes (Trim_code) corresponding to the specified relationship may be selected, and the clock signal CLK of the oscillator 210 is controlled to be operated at a target oscillation frequency according to the selected trimming code (i.e. the step S515).

From the above descriptions, the present invention provides a clock trimming apparatus and an associated clock trimming method. After the clock trimming apparatus starts to perform a clock trimming action, the frequency of the clock signal CLK is gradually increased, and a frequency division is performed on the clock signal CLK to generate a frequency-divided signal D. By judging whether the relationship between the frequency-divided signal D and the reference signal REF complies with a specified relationship, the clock trimming apparatus can judge whether the clock trimming action is completed.

In the above embodiments, after the clock trimming action is started, the frequency of the clock signal CLK is gradually increased from the lowest frequency. However, those skilled in the art will readily observe that numerous modifications and alterations may be made while retaining the teachings of the invention. For example, after the clock trimming action is started, the frequency of the clock signal CLK may be gradually decreased from the highest frequency. Under this circumstance, the increment of the trimming code may be replaced by a decrement, so that the frequency of the clock signal CLK is gradually decreased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A clock trimming apparatus receiving a reference signal, the clock trimming apparatus comprising:
   an oscillator having an input terminal receiving a bias signal and an output terminal generating a clock signal, wherein during a specified time duration of the reference signal, a frequency of the clock signal generated by the oscillator is correlated with an amplitude of the bias signal;
   a judging unit receiving the clock signal and the reference signal, wherein after a frequency division is performed on the clock signal, the judging unit generates a frequency-divided signal, wherein if the frequency-divided signal matches the reference signal, a pass signal generated by the judging unit is activated;
   a latching unit for generating a trimming completion signal, wherein after the pass signal is activated, the trimming completion signal is activated; and
   a tracking unit for receiving the reference signal, counting a pulse number of the reference signal, generating a trimming code, and providing the bias signal to the oscillator according to the trimming code, wherein after the trimming completion signal is activated, the trimming code is stopped being adjusted.

2. The clock trimming apparatus as claimed in claim 1, wherein the oscillator further has an enabling terminal receiving the reference signal, and the oscillator generates the clock signal during a high-level time period of the reference signal, wherein a rising edge of a first pulse of the clock signal is aligned with a rising edge of the reference signal.

3. The clock trimming apparatus as claimed in claim 1, wherein the judging unit comprises:
   a frequency divider having a reset terminal receiving the reference signal and an output terminal generating the frequency-divided signal, wherein when the reference signal is at a low-level state, the frequency divider is reset;
   a NOT gate receiving the reference signal; and
   an AND gate having a first input terminal connected with the output terminal of the NOT gate, a second input terminal receiving the frequency-divided signal and an output signal generating the pass signal, wherein when the pass signal is activated, the pass signal is at a high-level state.

4. The clock trimming apparatus as claimed in claim 1, wherein the judging unit comprises:
   a frequency divider having a reset terminal receiving the reference signal and an output terminal generating the pass signal, wherein when the reference signal is at a low-level state, the frequency divider is reset.

5. The clock trimming apparatus as claimed in claim 1, wherein the latching unit comprises:
   a latch for generating an output signal, wherein after the pass signal is activated, the output signal is activated; and
   an accumulating unit receiving the output signal from the latch, wherein after the output signal is activated for a specified number of consecutive times, the trimming completion signal is activated.

6. The clock trimming apparatus as claimed in claim 1, wherein the tracking unit comprises:
   a counter having an enabling terminal receiving the trimming completion signal, an input terminal receiving the reference signal, and an output terminal generating the trimming code, wherein after the reference signal is received by the input terminal of the counter, the pulse number of the reference signal is counted by the counter; and
   a bias current generating unit for providing the bias signal to the oscillator according to the trimming code,
   wherein the bias signal is a bias current and after the trimming completion signal is activated, the counter stops counting the pulse number of the reference signal, and the change of the trimming code is stopped.

7. The clock trimming apparatus as claimed in claim 1, wherein if a voltage level of the frequency-divided signal is changed during the specified time duration of the reference signal, it is determined that the frequency-divided signal matches the reference signal.

8. A clock trimming method, comprising steps of:
   (a) receiving a reference signal;
   (b) generating a clock signal according to an initial value of a trimming code;
   (c) performing a frequency division on the clock signal, thereby generating a frequency-divided signal;
   (d) judging whether a relationship between the frequency-divided signal and the reference signal complies with a specified relationship, wherein if the relationship between the frequency-divided signal and the reference signal does not comply with the specified relationship, a step (e) is performed, wherein if the relationship between the frequency-divided signal and the reference signal complies with the specified relationship, a step (f) is performed;
   (e) adding the trimming code by one increment and generating the clock signal according to the trimming code and the increment, and then going back to the step (c); and
   (f) controlling the clock signal to be operated at a target oscillation frequency according to the trimming code corresponding to the specified relationship.

9. The clock trimming method as claimed in claim 8, wherein when the clock signal is generated, a rising edge of a first pulse of the clock signal is aligned with a rising edge of the reference signal.

10. The clock trimming method as claimed in claim 9, wherein the clock signal is generated during a specified time duration of the reference signal.

11. The clock trimming method as claimed in claim 8, wherein if a voltage level of the frequency-divided signal is changed during a specified time duration of the reference signal, it is determined that the relationship between the frequency-divided signal and the reference signal complies with the specified relationship.

12. The clock trimming method as claimed in claim 8, wherein when the reference signal is received, a cumulative value is set as 0.

13. The clock trimming method as claimed in claim 12, wherein the step (d) of judging whether the relationship between the frequency-divided signal and the reference signal further comprises steps of:
   (d1) judging whether the frequency-divided signal matches the reference signal;
   (d2) if the frequency-divided signal does not match the reference signal, clearing the cumulative value, and then going back to the step (e); and
   (d3) if the frequency-divided signal matches the reference signal, adding 1 to the cumulative value, and judging whether the updated cumulative value reaches a preset value, wherein if the cumulative value does not reach a preset value, going back to the step (e), wherein if the cumulative value reaches the preset value, going back to the step (f).

14. The clock trimming method as claimed in claim 13, wherein the clock signal is controlled to be operated at the target oscillation frequency according to one of plural trimming codes corresponding to the specified relationship.

15. The clock trimming method as claimed in claim 8, wherein the frequency of the clock signal is gradually increased from a lowest frequency.

16. The clock trimming method as claimed in claim 8, wherein the frequency of the clock signal is gradually decreased from a highest frequency.

* * * * *